(12) United States Patent
Jo

(10) Patent No.: US 12,190,937 B2
(45) Date of Patent: Jan. 7, 2025

(54) ANTI-ROW-HAMMER MEMORY DEVICE

(71) Applicant: SAMSUNG ELECTRONICS CO., LTD., Suwon-si (KR)

(72) Inventor: Byoung Kon Jo, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 198 days.

(21) Appl. No.: 17/822,241

(22) Filed: Aug. 25, 2022

(65) Prior Publication Data

US 2023/0162781 A1 May 25, 2023

(30) Foreign Application Priority Data

Nov. 22, 2021 (KR) ........................ 10-2021-0161039

(51) Int. Cl.
*G11C 8/00* (2006.01)
*G11C 11/408* (2006.01)

(52) U.S. Cl.
CPC ...... *G11C 11/4085* (2013.01); *G11C 11/4087* (2013.01)

(58) Field of Classification Search
CPC .................................................. G11C 11/4085
USPC ..................................................... 365/230.06
See application file for complete search history.

(56) References Cited

U.S. PATENT DOCUMENTS

| 7,692,994 | B2 | 4/2010 | Pyeon |
| 9,269,436 | B2 | 2/2016 | Mandava et al. |
| 9,685,240 | B1 | 6/2017 | Park |
| 9,812,185 | B2 | 11/2017 | Fisch et al. |
| 2020/0051659 | A1* | 2/2020 | Matsubara ........... G11C 29/832 |
| 2020/0152256 | A1* | 5/2020 | Seo ....................... G11C 5/145 |

FOREIGN PATENT DOCUMENTS

| KR | 10-2000-0045870 | 7/2000 |
| KR | 10-2001-0059020 | 7/2001 |
| KR | 10-2006-0044855 | 5/2006 |
| KR | 10-2009-0032062 | 3/2009 |
| KR | 10-2010-0054566 | 5/2010 |
| KR | 10-2011-0059124 | 6/2011 |
| KR | 10-2013-0045495 | 5/2013 |
| KR | 10-2015-0014702 | 2/2015 |
| KR | 10-2017-0053422 | 5/2017 |
| KR | 10-2018-0049502 | 5/2018 |
| KR | 10-2020-0055190 | 5/2020 |

* cited by examiner

*Primary Examiner* — Hoai V Ho
(74) *Attorney, Agent, or Firm* — F. Chau & Associates, LLC

(57) ABSTRACT

A memory device is provided that comprises: a memory cell array having a plurality of memory cells connected between a plurality of word lines and a plurality of column lines; a three-phase word line controller configured to generate a selected operating voltage, a first unselected operating voltage, and a second unselected operating voltage having a lower level than the first unselected operating voltage; and a row decoder connected to the plurality of word lines, configured to apply the selected operating voltage to an activated word line on the basis of a row address, and to apply the first unselected operating voltage or the second unselected operating voltage to a deactivated word line.

20 Claims, 10 Drawing Sheets

ANTI-ROW-HAMMER MEMORY DEVICE

CROSS-REFERENCE

This application claims priority under 35 U.S.C. § 119 to Korean Patent Application No. 10-2021-0161039, filed on Nov. 22, 2021 in the Korean Intellectual Property Office (KIPO), the disclosure of which is incorporated by reference herein in its entirety.

FIELD

The present disclosure relates to a dynamic random-access memory (DRAM) device.

DISCUSSION

Semiconductor memory devices for storing data may be broadly classified into volatile memory devices and non-volatile memory devices. In a volatile memory device such as a DRAM, in which data is stored by charging or discharging a cell capacitor, the stored data is retained while the power is applied. However, when the power is cut off, the stored data may be lost. A non-volatile memory device may store data even when the power supply is cut off. A volatile memory device is typically used as a main memory of a computer or the like, while a non-volatile memory device is typically used as a large-capacity memory that stores program instructions and/or data in a wide range of application devices, such as in computers and portable communications devices.

In a volatile memory device such as a DRAM, the cell charge accumulated in the memory cell may be lost by a leakage current. Before the cell charge is lost and the data is degraded, the charge of the memory cell may be recharged to prevent such loss of charge and data degradation, and such recharging of the cell charge is called a refresh operation. Thus, a refresh operation is preferably repeated before the cell charge is lost and data degraded.

SUMMARY

With ongoing development of process technology, such as increases in integration, a cell interval between DRAMs may narrow. Further, due to a reduction in the cell interval, a disturbance due to adjacent cells and word lines may act as an increasingly important data integrity factor. Even if the disturbance is concentrated at a specific cell, it is difficult to restrict an access to a specific address in a random-access memory such as a DRAM. Therefore, disturbances at specific cells may occur, which may also affect the refresh characteristics of such cells.

Embodiments of the present disclosure may provide a memory device having high data reliability against a row hammer effect in a reduced-size memory device, and a method for operating the memory device.

An embodiment of the present disclosure provides a memory device comprising: a memory cell array having a plurality of memory cells connected between a plurality of word lines and a plurality of column lines; a three-phase word line controller configured to generate a selected operating voltage, a first unselected operating voltage, and a second unselected operating voltage having a lower level than the first unselected operating voltage; and a row decoder connected to the plurality of word lines, configured to apply the selected operating voltage to an activated word line on the basis of a row address, and to apply the first unselected operating voltage or the second unselected operating voltage to a deactivated word line.

An embodiment of the present disclosure provides a memory device comprising: a plurality of memory cell regions connected between a plurality of word lines and column lines and disposed in a slave layer; a voltage generator disposed on a master layer, and configured to generate a selected operating voltage, a first unselected operating voltage, and a second unselected operating voltage having a level lower than the first unselected operating voltage; a plurality of sub-word line drivers disposed on the slave layer and connected to the plurality of word lines, and configured to apply an operating voltage to the word line; and a three-phase word line controller disposed in the slave layer, and configured to control the plurality of sub-word line drivers to apply the selected operating voltage to a first word line selected on the basis of the row address, apply the second unselected operating voltage to a second word line adjacent to the first word line, and apply the first unselected operating voltage to a third word line that is not adjacent to the first word line.

An embodiment of the present disclosure provides a memory device comprising: memory cell regions, each disposed on a plurality of word lines and a plurality of column lines; a PMOS transistor which is connected to a word line activation address line at one side, and configure to output a selected operating voltage; a first NMOS transistor which is connected to a first power voltage line different from the word line activation address line at one side, and configured to output a first unselected operating voltage; a second NMOS transistor which is connected to a second power voltage line different from the first power voltage line at one side, and configured to output a second unselected operating voltage lower than the first unselected operating voltage; a first sub-word line driver configured to apply the selected operating voltage to the first word line on the basis of a row address; a second sub-word line driver configured to apply the second unselected operating voltage to a second word line adjacent to the first word line; and a third sub-word line driver configured to apply the first unselected operating voltage to a third word line adjacent to the second word line in a direction opposite to the first word line.

However, embodiments of the present disclosure are not restricted to embodiments set forth herein. The above and other embodiments of the present disclosure may become more apparent to those of ordinary skill in the art to which the present disclosure pertains by referencing the detailed description of the present disclosure as provided below.

DETAILED DESCRIPTION

Figure 1:
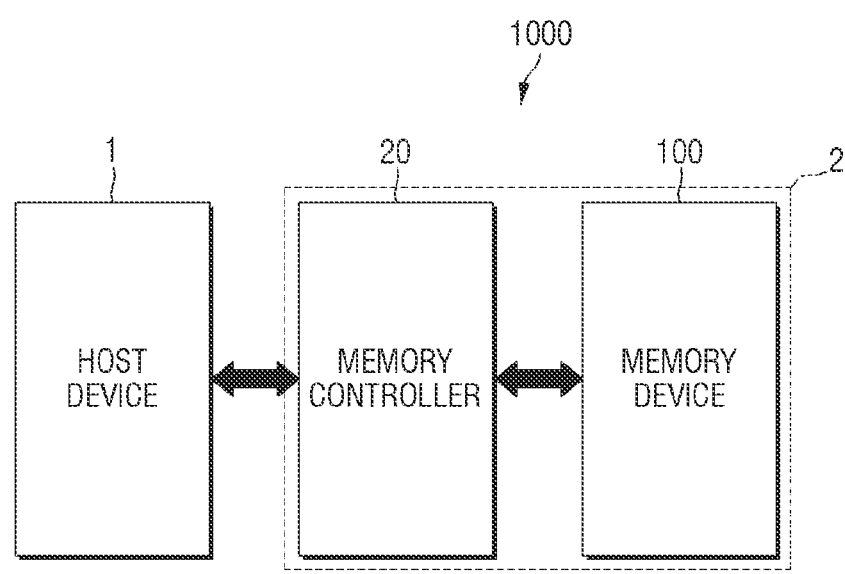
FIG. 1 is a block diagram that shows an electronic system including a host device and a memory system according to an embodiment of the present disclosure.

As shown in FIG. 1, an electronic system including a memory system is indicated generally by the reference numeral 1000 according to an embodiment of the present disclosure.

Referring to FIG. 1, the electronic system may include a host device 1 and a memory system 2. The memory system may include a memory controller 20 and at least one memory device 100.

The host device 1 may communicate with the memory system 2, using an interface protocol such as a Peripheral Component Interconnect-Express (PCI-E), an Advanced Technology Attachment (ATA), a Serial ATA (SATA), a Parallel ATA (PATA), a serial attached SCSI (SAS), a Compute eXpress Link (CXL), or the like. Further, the interface protocols between the host device 1 and the memory system 2 is not limited to the above example, and may be one of other interface protocols such as a Universal Serial Bus (USB), a Multi-Media Card (MMC), an Enhanced Small Disk Interface (ESDI), an Integrated Drive Electronics (IDE), or the like.

According to an embodiment, each of one or more memory devices 100 may be a dynamic random-access memory (DRAM) such as a Double Data Rate Synchronous Dynamic Random Access Memory (DDR SDRAM), a Low Power Double Data Rate (LPDDR) SDRAM, a Graphics Double Data Rate (GDDR) SDRAM, a Rambus Dynamic Random Access Memory (RDRAM), or the like.

Figure 2:
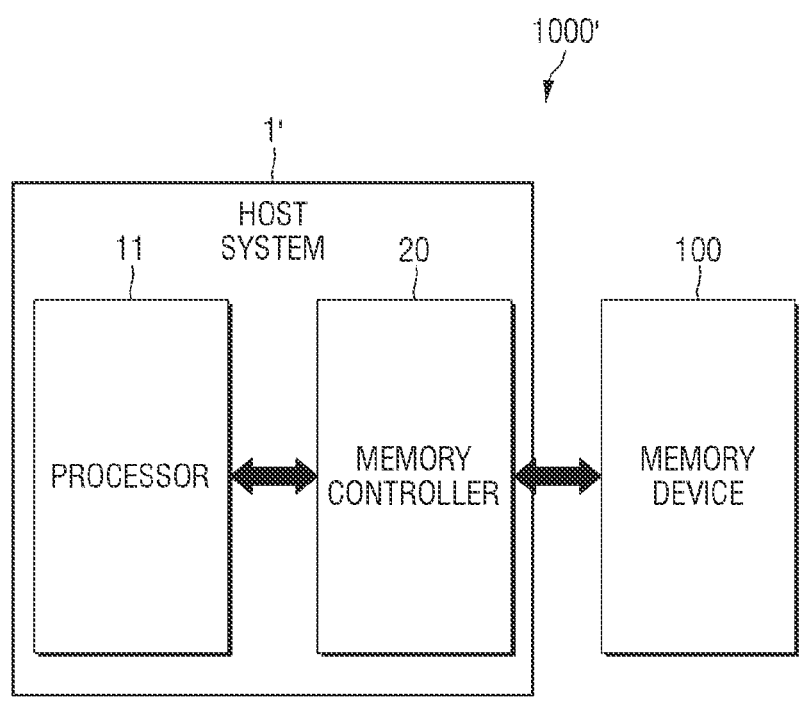
FIG. 2 is a block diagram that shows a host system connected to a memory device according to an embodiment of the present disclosure.

Turning to FIG. 2, an electronic system including a host system connected to a memory device is indicated generally by the reference numeral 1000'.

Referring to FIG. 2, a host system 1' may include a processor 11 and a memory controller 20. The processor 11 may control the overall operation of the electronic system 1000', and in particular, may control the operation of each component constituting an electronic system. The processor 11 may be implemented as a general-purpose processor, a dedicated processor, an application processor, or the like. The processor 11 may include one or more CPU cores and may be connected to the memory controller 20.

According to an embodiment, the processor 11 may further include an accelerator block, which is a dedicated circuit for high-speed data computation such as an Artificial Intelligence (AI) data computation. The accelerator block may include a computation block such as a Graphics Processing Unit (GPU), a Neural Processing Unit (NPU), a Data Processing Unit (DPU), or the like. The accelerator block may be included in the processor 11, but may alternately be implemented as separate chips physically independent according to other examples.

The host system 1' may communicate with the memory device 100 based on one or more standards such as Double Data Rate (DDR), low power double data rate (LPDDR), Graphics Double Data Rate (GDDR), Wide I/O, High Bandwidth Memory (HBM), Hybrid Memory Cube (HMC), Compute eXpress Link (CXL), or the like.

Figure 3:
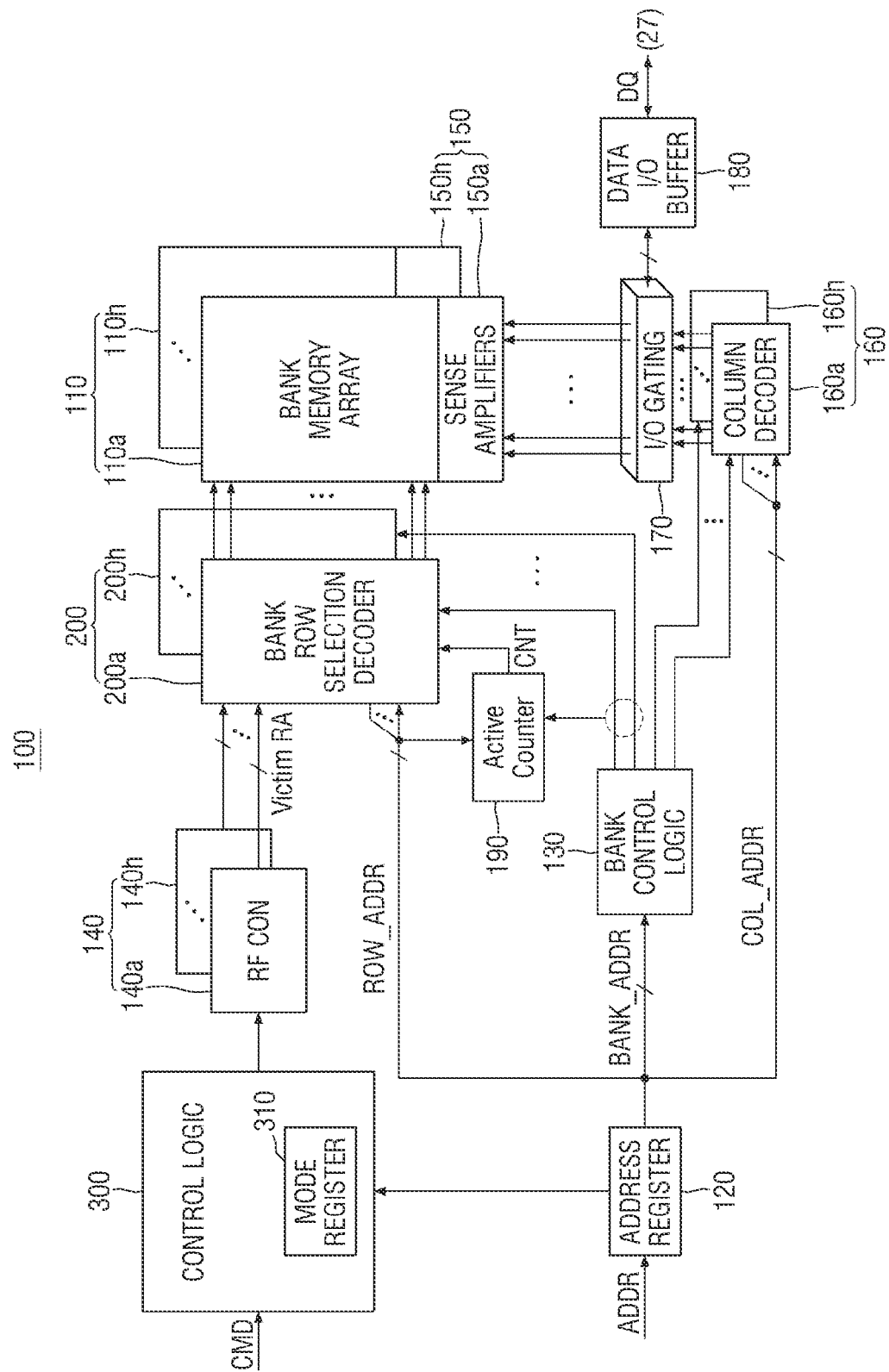
FIG. 3 is a block diagram that shows a memory device according to an embodiment of the present disclosure.
Figure 4:
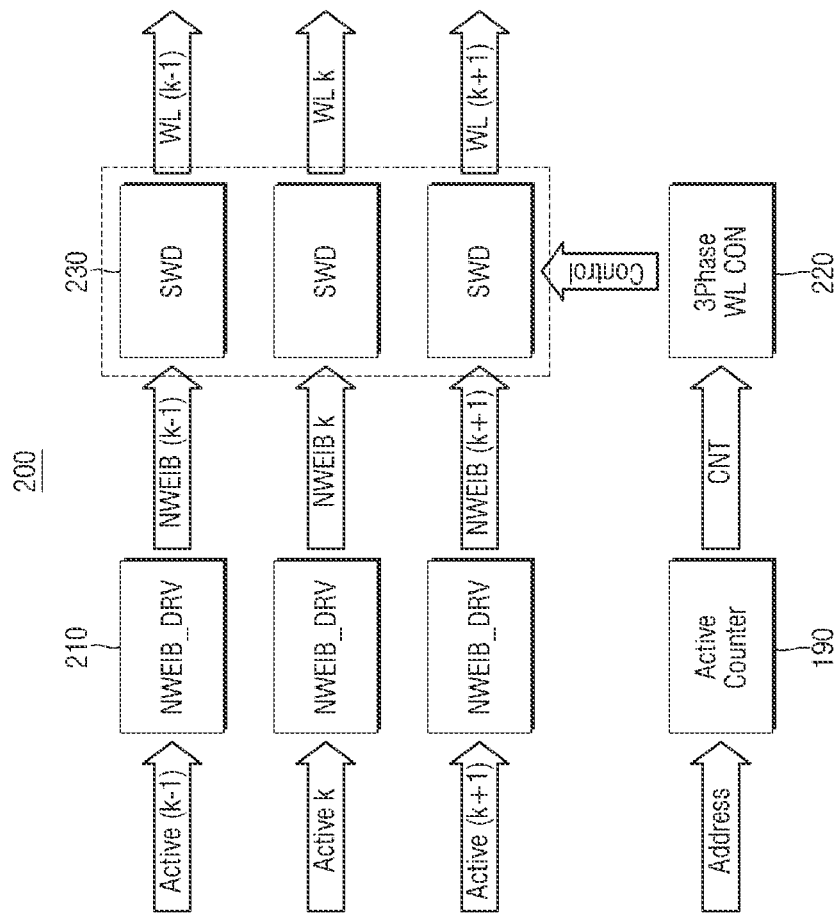
FIG. 4 is a hybrid diagram that shows a row decoder according to an embodiment of the present disclosure.

Turning now to FIG. 3, a memory device is indicated generally by the reference numeral 100 according to an embodiment. As shown in FIG. 4, a row decoder is indicated generally by the reference numeral 200 according to an embodiment.

Referring to FIG. 3, the memory device 100 according to an embodiment may include memory control logic 300, an address register 120, bank control logic 130, a row decoder 200, a column decoder 160, a memory cell array 110, a sense amplifier 150, an I/O gating circuit 170, a data I/O buffer 180, and a refresh controller 140.

The memory cell array 110 may include a plurality of memory banks, such as a plurality of bank arrays 110a to 110h. The row decoder 200 includes a plurality of bank row decoders 200a to 200h respectively connected to corresponding ones of the plurality of bank arrays 110a to 110h, the column decoder 160 includes a plurality of column decoders 160a to 160h respectively connected to corresponding ones of the plurality of bank arrays 110a to 110h, and the sense amplifier 150 may include a plurality of sense amplifiers 150a to 150h respectively connected to corresponding ones of the plurality of bank arrays 110a to 110h.

Each of the bank arrays 110a to 110h may include a plurality of blocks BLK0 to BLKn. Each block BLK may include a plurality of memory cells. Thus, the memory cell array 110 may include a greater plurality of memory cells. For example, the memory cell may be a dynamic random-access memory (DRAM) cell. In this case, the memory interface 27 may perform communications, on the basis of one or more of the aforementioned standards such as DDR, LPDDR, GDDR, Wide I/O, a HBM, HMC, CXL, or the like.

The memory device 100 may receive a command/address signal C/A on the basis of the clock signal CK.

The address register 120 may receive address information from the memory controller 20. The address information ADD may include a bank address BANK_ADDR, a row address ROW ADDR, and a column address COL_ADDR. The address register 120 may convert the address information into an internal address of the memory device 100. For example, the address register 120 may provide the bank address BANK_ADDR to the bank control logic 130, may provide the row address ROW_ADDR to the row decoder 200, and may provide the column address COL_ADDR to the column decoder 160.

The bank control logic 130 may generate bank control signals in response to the bank address BANK_ADDR. In response to the bank control signals, the bank row decoder corresponding to the bank address BANK_ADDR among the plurality of bank row decoders 200a to 200h is activated, and the bank column decoder corresponding to the bank address BANK_ADDR among a corresponding plurality of bank column decoders 160a to 160h may be activated.

Each row address ROW_ADDR that is output from the address register 120 may be applied to the row decoder 200.

Among the bank row decoders 200a to 200h, the bank row decoder activated by the bank control logic 130 may decode the row address ROW_ADDR to activate the word line corresponding to the row address and apply an operating voltage. For example, the activated bank row decoder may apply different word line operating voltages for each row corresponding to the row address.

Referring to FIGS. 3 and 4, the row decoder 200 includes a plurality of bank row decoders 200a to 200h, and each bank row decoder (e.g., 200a) may include a global row driver (NWEIB_DRV) and a plurality of sub-word line drivers (Sub-Word line Decoder, SWD).

The global row driver (NWEIB_DRV) selects and activates any one memory cell region among the plurality of memory cell regions, or any one bank among the plurality of banks, based on the row address such as Active (k−1), Active k, or Active (k+1), and the sub-word line driver SWD belonging to the activated memory cell region or bank generates the operating voltage for each word line according to the control signal CONTROL and applies the operating voltage to the corresponding word line. The word line operating voltage may be a selected operating voltage in the case of an activated word line, or a first unselected operating voltage or a second unselected operating voltage in the case of a deactivated word line. The first unselected operating voltage (Normal) is a voltage applied to the deactivated word line that is not accessed by the row address, and the second unselected operating voltage (Unselected) may be a voltage that is applied to a sacrifice row when a row hammer effect is more likely to occur. The second unselected operating voltage may be an operating voltage of a lower level than the first unselected operating voltage. The sub-word line driver SWD may be controlled by the control signal CONTROL of a three-phase word line controller 220.

For example, the activated bank row decoder 200a may apply a refresh operating voltage to a row hammer row or a sacrifice row based on the refresh command. The active row address may be a row based on address information transmitted from the memory controller 20 to the memory device 100 along with the active command according to an embodiment. Alternatively, the active row address may be a row of active address in which the active command is transmitted from the memory controller to the memory device according to an embodiment, and which is autonomously determined by the memory device to perform the active command. At this time, the active command may be an instruction on a data reading operation, a writing operation, or an erase operation to the memory cell. The refresh command may be an instruction which causes the refresh operation to be performed on at least one of the row hammer row and/or the sacrifice row.

The memory device 100 may further include an active counter 190. When the active counter 190 receives the row address from the address information of the memory controller 20, the active counter 190 may count the number of times of access for each word line. According to an embodiment, if the number of times of access to a particular row, such as the number of times of access to the same row, exceeds a preset threshold number, the active counter 190 determines that the row hammer effect is likely to occur, and may output the control signal to the three-phase word line controller 220.

According to an embodiment, the three-phase word line controller 220 may be activated on the basis of the control signal CNT of the active counter 190 to perform the operations. The three-phase word line controller 220 may control the sub-word line drive SWD such that the activated word line (WL k) in which the row hammer effect is likely about to occur continuously applies the selected operating voltage in accordance with the control signal of the active counter 190, the sacrificial word line of the activated word line, that is, the adjacent word lines (WL (k−1), WL (k+1)) apply the second unselected operating voltage, and the non-adjacent deactivated word line applies the first unselected operating voltage. The three-phase word line controller 220 may be described in greater detail with respect to FIG. 6, without limitation thereto.

The column decoder 160 may include a column address latch. The column address latch may receive the column address COL_ADDR from the address register 120 and may temporarily store the received column address COL_ADDR. In addition, the column address latch may gradually increase the received column address COL_ADDR in a burst mode. The column address latch may apply a temporarily stored or gradually increased column address COL_ADDR to each of the bank column decoders 160a to 160h.

Among the bank column decoders 160a to 160h, the bank column decoder activated by the bank control logic 130 may activate a sense amplifier corresponding to the bank address BANK_ADDR and the column address COL_ADDR through the I/O gating circuit 170.

The I/O gating circuit 170 may include, together with circuits for gating the I/O data, input data mask logic, reading data latches for storing data output from the bank arrays 110a to 110h, writing drivers for writing the data in the bank arrays 110a to 110h, or the like.

The data DQ to be read from one of the bank arrays 110a to 110h is sensed by one of the sense amplifiers 150a to 150h corresponding to the one bank array, and may be stored in the reading data latches. The data DQ stored in the reading data latches may be provided to the memory controller through the data I/O buffer 180. The data DQ to be written to one of the bank arrays 110a to 110h may be provided from the memory controller to the data I/O buffer 180. The data DQ provided to the data I/O buffer 180 may be written in one bank array through the respective writing driver.

The refresh controller 140 may control the bank row decoder 200 of the memory device 100 to perform the refresh operation. For example, the refresh controller 140 may control the bank row decoder of the memory device 100 to perform the refresh operation on any one bank array 110a activated by the bank control logic 130 on the basis of the refresh command from the memory controller 20. According to an embodiment, the refresh controller 140 may include a plurality of refresh controllers 140a to 140h corresponding to each of the bank row decoders 200a to 200h.

The memory control logic 300 may generally control the operation of the memory device 100. According to an embodiment, the memory control logic 300 may generate first control signals such that an activation operation, such as, for example, a writing operation or a reading operation, is performed on the memory device 100. According to an embodiment, the memory control logic 300 may control the refresh controller 140 with a refresh controller control signal such that the refresh operation is performed on the memory device 100.

The memory control logic 300 may further include a mode register 310. The mode register 310 may store a plurality of operating mode parameters about the operation of the memory device 100. According to an embodiment, the three-phase word line controller 220 may be controlled on the basis of the operating mode parameters of the mode register 310.

For example, the mode register 310 may control the word line controller 220 such that the sacrificial word line operates at the second unselected operating voltage, while the word line in which the row hammer effect is likely to occur is activated, on the basis of the first operating mode parameter. For example, the mode register 310 may control the three-phase word line controller 220 such that the sacrificial word line operates at the second unselected operating voltage after a lapse of a preset time from the time point when the word line in which the row hammer effect is likely to occur is activated on the basis of the second operating parameter. The preset time is a time that is preset in the mode register according to an embodiment, and may be a time that is adjusted on the basis of the number of times of active counting by the active counter 190 according to an embodiment.

In FIG. 3, although the refresh controller 140 and the memory control logic 300 are separately shown, they may be implemented as an independent configuration according to an embodiment, or the memory control logic 300 may be implemented to include the refresh controller 140 according to an embodiment.

The memory control logic 300 may generate an internal command by decoding the command CMD received from the memory controller 20. Although the memory control logic 300 and the address register 120 are shown as separate components in FIG. 3, the memory control logic 300 and the address register 120 may be implemented as a single inseparable component. Although FIG. 3 shows that the command CMD and the address ADDR are each provided by separate signals, the address may be considered to be included in the command as shown in the LPDDR5 standard, or the like.

Figure 5:
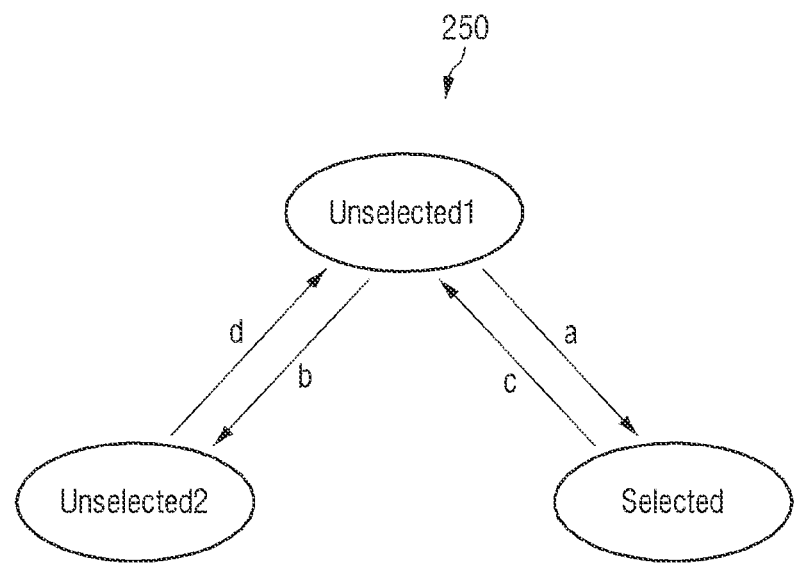
FIG. 5 is a state diagram for conceptually explaining a method for operating a three-phase word line controller according to an embodiment of the present disclosure.

Turning to FIG. 5, a method for operating the three-phase word line controller is indicated generally by the reference numeral 250, according to an embodiment.

Referring to FIG. 5, for example, the three-phase word line controller 210 may control each word line to operate at three operating voltages. When a row hammer effect does not occur, that is, in the case of a normal operation, the word line may operate at the selected operating voltage (Selected) and the first unselected operating voltage (Unselected 1) (i.e., the word line may operate while being switched in a direction a or in a direction c). That is, the selected operating voltage, for example, read operating voltage/write operating voltage/erase operating voltage/refresh operating voltage, or the like is applied to the first word line accessed on the basis of the row address received together with the active command, and the first unselected operating voltage is applied to the remaining word lines except the first word line. The selected operating voltage may be, for example, voltage of a positive level, and the first unselected operating voltage may be, for example, a ground voltage or voltage of a weak negative level (i.e., a negative voltage close to ground, for example, −0.1 V).

However, when the row hammer effect occurs, the sacrificial word line adjacent to the first word line operates at the first unselected operating voltage due to the selected operating voltage applied to the first word line activated in the row hammer operating mode, it may be affected by the bit flip phenomenon or the like. When a second unselected operating voltage lower than the first unselected operating voltage is applied to the sacrificial word line, since a difference between the selected operating voltage and the voltage level increases, the likelihood of charge transfer may greatly decrease. Therefore, the first word line activated when the row hammer effect occurs is switched in the direction a and operates, and the second word line (that is, the sacrifice row) adjacent to the first word line is switched from the first unselected operating voltage to the second unselected operating voltage and operates (b), and then, when the first word line is deactivated (c), the second word line is also switched from the second unselected operating voltage to the first unselected operating voltage again (d). The first unselected operating voltage may continue to be applied to the third word lines that do not correspond to the sacrifice row.

Figure 6:
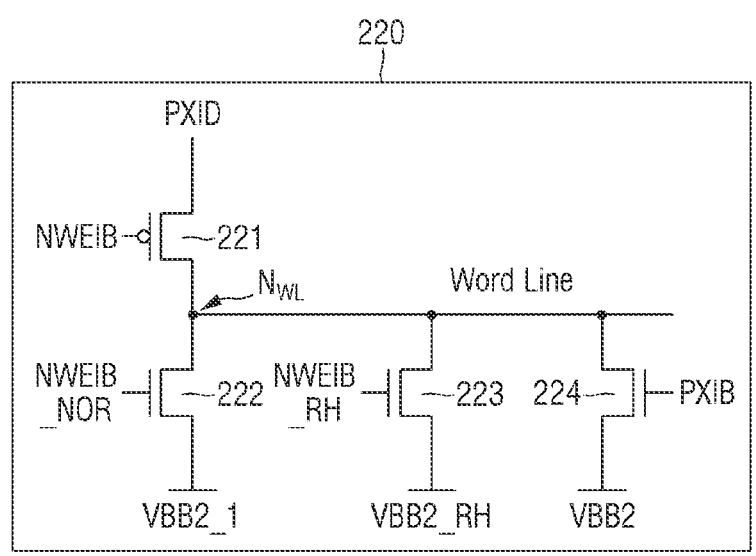
FIG. 6 is a circuit diagram specifically showing a three-phase word line controller according to an embodiment of the present disclosure.
Figure 7:
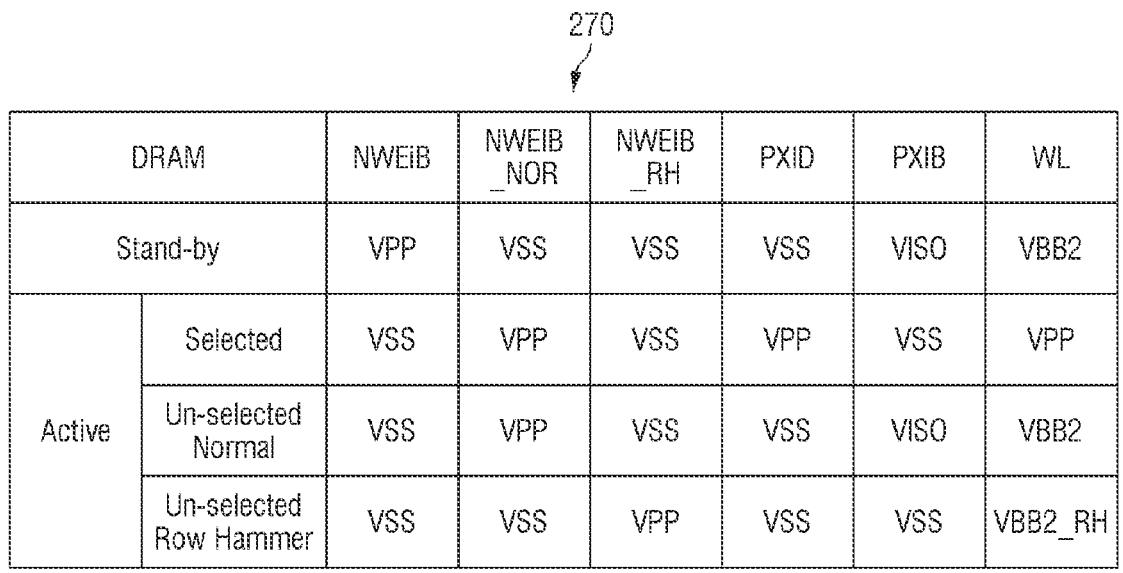
FIG. 7 is a tabular diagram for explaining an operating voltage of a three-phase word line controller based on an operating mode according to an embodiment of the present disclosure.

Turning now to FIG. 6, a three-phase word line controller is indicated generally by the reference numeral 220, according to an embodiment. As shown in FIG. 7, a table for explaining the operating voltage of the three-phase word line controller based on the operating mode is indicated generally by the reference numeral 270, according to an embodiment.

Referring to FIGS. 6 and 7, the three-phase word line controller 220 may include a plurality of transistors. According to an embodiment, the three-phase word line controller 220 may include one PMOS transistor 221 and two NMOS transistors 222 and 223. The PMOS transistor 221 is connected between a word line activation address line PXID and a word line node $N_{WL}$, and may output the selected operating voltage generated by being turned on according to the word line enable signal NWEIB to the sub-row driver SWD. The NMOS transistor 222 is connected between a first power voltage line VBB2_1 and the word line node $N_{WL}$, is turned on based on the NOR signal, or a word line disable signal, of the word line enable signal at the time of the normal operation, and may output the first unselected operating voltage to the sub-row driver SWD. The NMOS transistor 223 is connected between a second power voltage line VBB2_RH and the word line node $N_{WL}$, is turned on based on the control signal NWEIB_RH at the time of row hammer operation, and may output the second unselected operating voltage to the sub-row driver (SWD).

According to an embodiment, a positive power voltage may be supplied to the word line activation address line PXID, and negative power voltages may be supplied to the first power voltage line VBB2_1 and to the second power voltage line VBB2_RH, where a voltage of lower level than that of the first power voltage line VBB2_1 may be supplied to the second power voltage line VBB2_RH.

The three-phase word line controller 220 may further include a NMOS transistor 224. The NMOS transistor 224 is connected between a third power voltage line VBB2 and the word line node $N_{WL}$, is turned on based on a word line (WL k), and may output the first unselected operating voltage to the sub-row driver SWD. Although the first power voltage lines 222 (VBB2_1) and the third power voltage lines 224 (VBB2) have been described separately, they may be implemented as one power voltage line VBB2 in an embodiment.

Referring to FIG. 7, in a stand-by mode, since the NWEIB signal is at a VPP level, the PMOS transistor 221 is turned off, and since NWEIB_NOR and NWEIB_RH are at a VSS level, the NMOSs 222 and 223 are turned off. Since the PXIB signal is at an isolation voltage level VISO, when the NMOS transistor 224 is turned on, the operating voltage based on the third power voltage line VBB2 is output to the word line WL.

In the case of the first word line activated by the row address, since the NWEIB signal is at the VSS level, when the PMOS transistor 221 is turned on, the VPP voltage level supplied to the word line activation address line PXID is output to the word line WL. The remaining NMOS transistors 222, 223, and 224 are turned off by the gate signals NWEIB_NOR, NWEIB_RH, and PXIB, respectively.

In the case of a second word line that is deactivated at the time of the normal operation or a third word line that is not adjacent even in the row hammer operation, since the NWEIB signal is at the VPP level, the PMOS transistor 221 is turned off, and since the NWEIB_NOR signal is at the VPP level, the NMOS transistor 222 is turned on, and the operating voltage based on the first power voltage line VBB2_1 is output to the word line WL. The remaining NMOS transistors 223 and 224 are turned off by the gate signals NWEIB_RH and PXIB.

In the case of the second word line of the sacrifice row, which is deactivated at the time of row hammer operation, since the NWEIB signal is at the VPP level, the PMOS transistor 221 is turned off, and since the NWEIB_RH signal is at the VPP level, the NMOS transistor 223 is turned on, and the operating voltage based on the second power voltage line VBB2_RH is output to the word line WL. The remaining NMOS transistors 222 and 224 are turned off by the gate signals NWEIB_NOR and PXIB.

Turning to FIGS. 8 to 11, time versus voltage graphs showing the operating voltages of the word lines are indicated generally by reference numerals 330, 340, 350 and 360, respectively.

Figure 8:
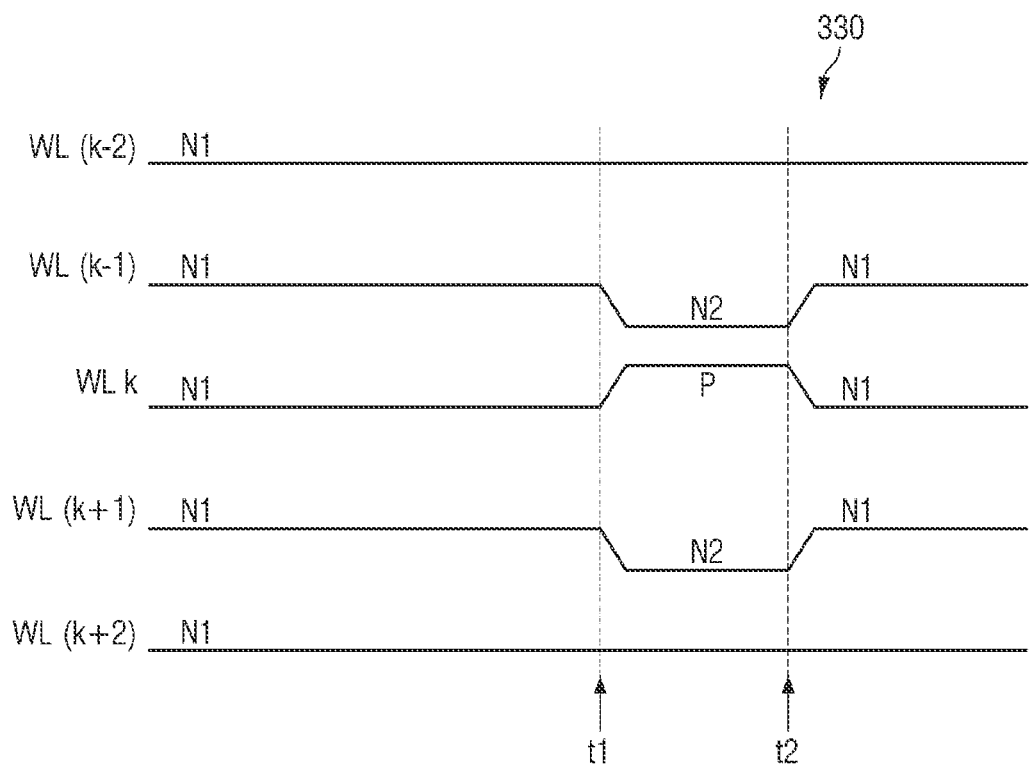
FIG. 8 is a graphical diagram showing a time-voltage graph for an operating voltage of a word line according to an embodiment of the present disclosure.

Referring to FIG. 8, when the word line (WL k) is activated at a time point t1 according to an embodiment, the selected operating voltage P is applied to the word line (WL k). The adjacent word lines WL (k−1) and WL (k+1) are switched to the second unselected operating voltage N2 between time points t1 and t2 at which the word line (WL k) is activated. At this time, the first unselected operating voltage N1 may be applied to the non-adjacent word lines WL (k−2) and WL (k+2).

Figure 9:
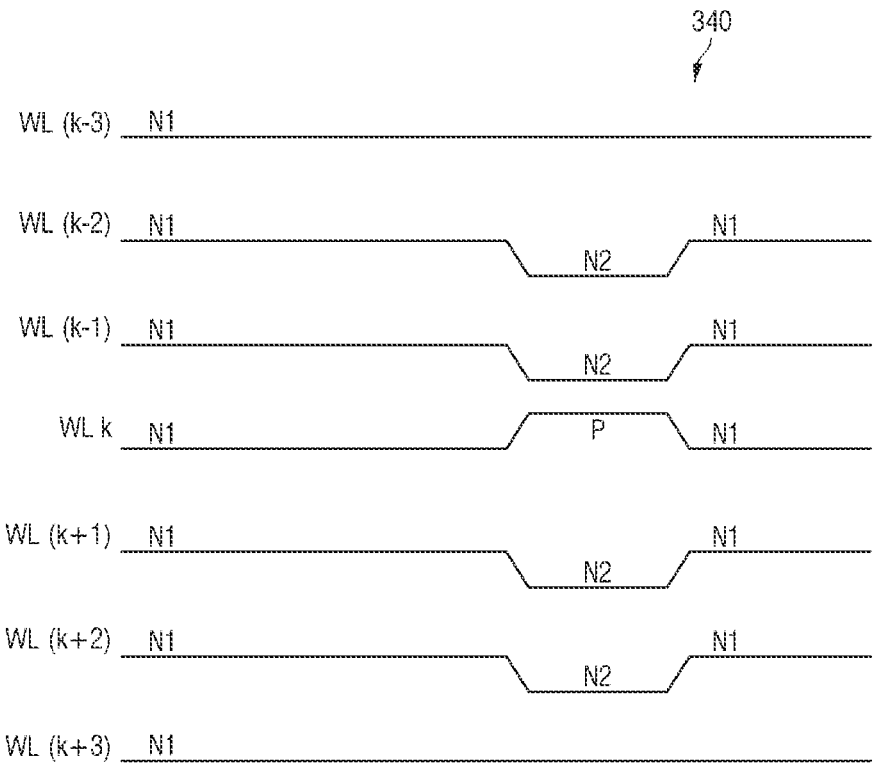
FIG. 9 is a graphical diagram showing a time-voltage graph for an operating voltage of a word line according to an embodiment of the present disclosure.

Referring to FIG. 9, the range of adjacent word lines according to an embodiment may include at least two or more word lines on one side of the activated word line. In other words, unlike the embodiment of FIG. 8, the adjacent word line may include not only the word lines WL (k−1) and WL (k+1) next to the activated word line (WL k), but also the next word lines WL (k−2) and WL (k+2).

When the word line (WL k) is activated even in the case of normal operation according to an embodiment, it is possible to cause the adjacent word line to operate at the second unselected operating voltage N2 as in the embodiments of FIGS. 8 and 9. Alternatively, in the case of normal operation according to an embodiment, it is possible to cause the adjacent word line to operate at the first unselected operating voltage N1 and cause the adjacent word line to operate at the second unselected operating voltage N2 only when a row hammer effect occurs.

Figure 10:
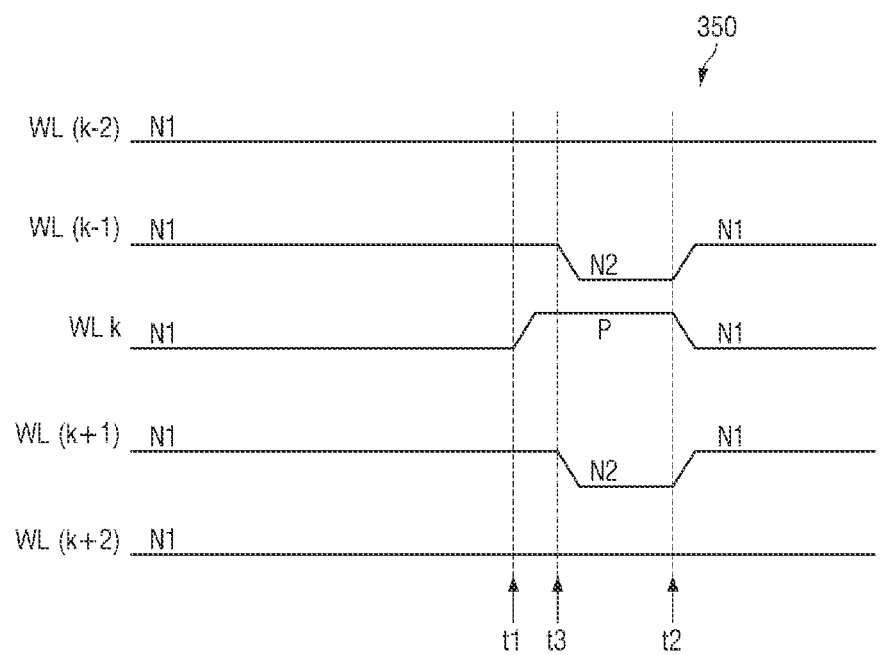
FIG. 10 is a graphical diagram showing a time-voltage graph for an operating voltage of a word line according to an embodiment of the present disclosure.

Referring to FIG. 10, the time point at which the second unselected operating voltage N2 is applied to the adjacent word line according to an embodiment may be different from the time point at which the word line (WL k) is activated. According to an embodiment, when the word line (WL k) is activated at the time point t1, the number of activations is counted, and when the count exceeds a threshold number at the time point t3, the second unselected operating voltage is switched from the first unselected operating voltage, and may be applied to the adjacent word line. Alternatively, when the word line (WL k) is activated at the time point t1 according to another embodiment, the second unselected operating voltage is switched from the first unselected operating voltage, and may be applied to the adjacent word line at the time point t3 after the lapse of the time set in the mode register 310.

According to an embodiment, the time point at which the second unselected operating voltage is switched to the first unselected operating voltage again on the adjacent word line may be the time point t2 at which the activated word line (WL k) is deactivated.

Figure 11:
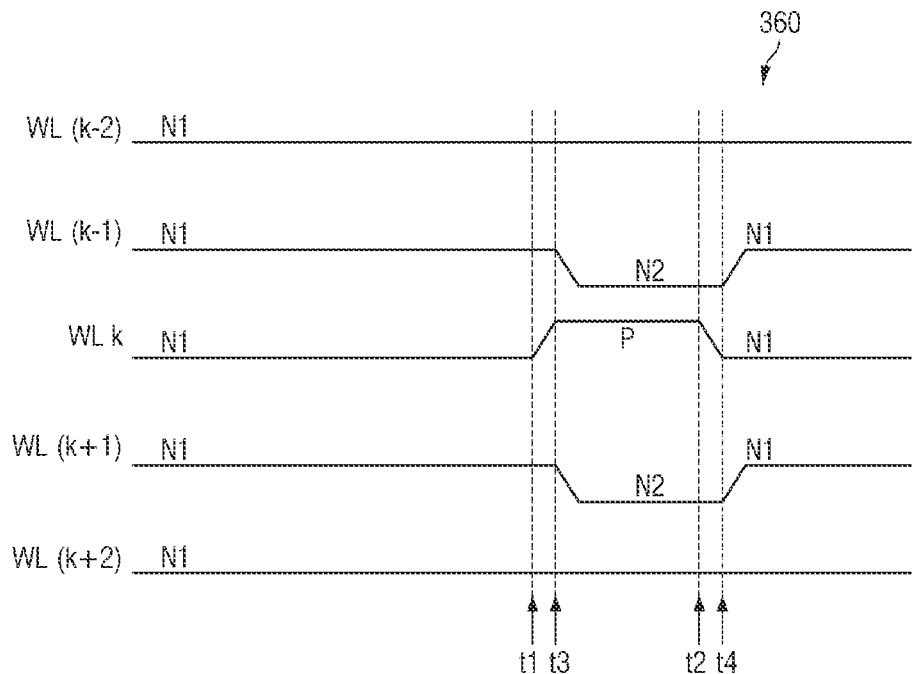
FIG. 11 is a graphical diagram showing a time-voltage graph for an operating voltage of a word line according to an embodiment of the present disclosure.

Alternatively, according to an embodiment, the time point at which the second unselected operating voltage is switched to the first unselected operating voltage again on the adjacent word line may be a time point t4 different from the time point t2 at which the activated word line (WL k) is deactivated as shown in FIG. 11. At this time, the time from the time point t2 to the time point t4 may be set by the mode register according to an embodiment.

Figure 12:
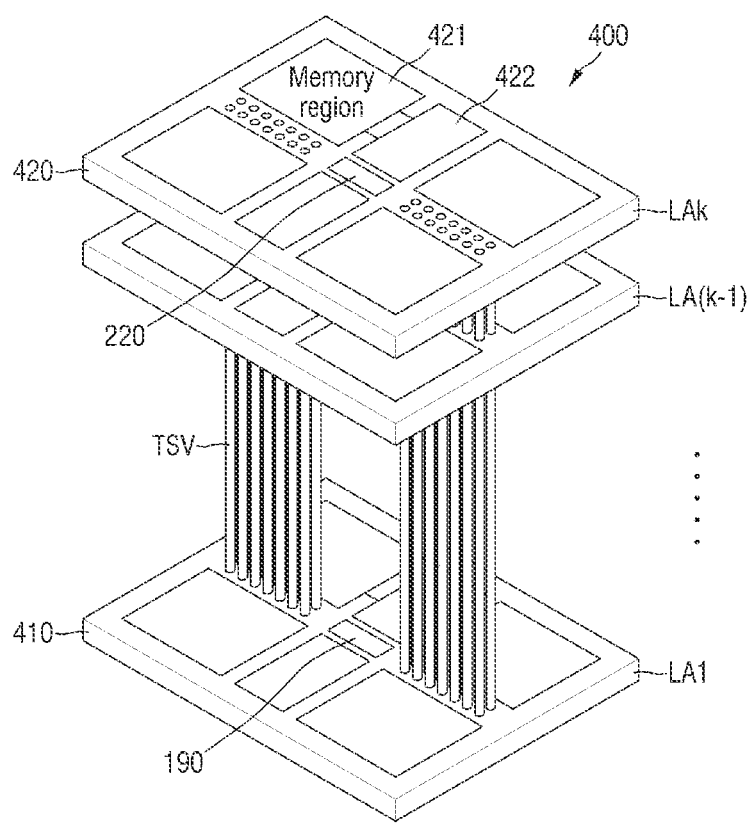
FIG. 12 is an isometric partial-assembly diagram showing a structure of a stacked memory device according to an embodiment of the present disclosure.
Figure 13:
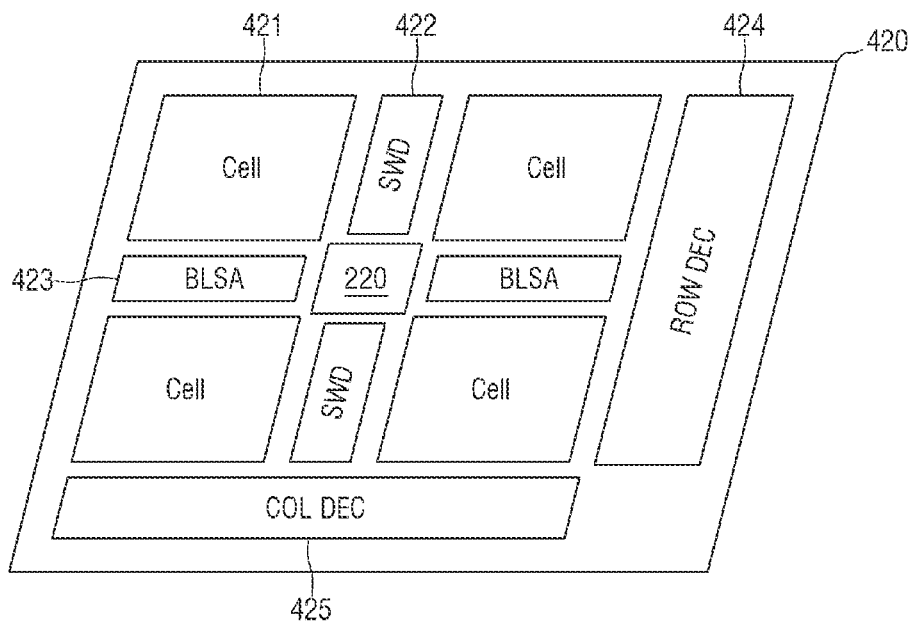
FIG. 13 is a skewed block diagram specifically showing a second semiconductor layer according to an embodiment of the present disclosure.

Turning now to FIG. 12 a structure of a stacked memory device is indicated by the reference numeral 400, according to an embodiment. As shown in FIG. 13, a second semiconductor layer is indicated by the reference numeral 420, according to an embodiment.

Referring to FIGS. 12 and 13, a memory device 400 may include a plurality of semiconductor dies or semiconductor layers LA1 to Lak (where k is a natural number of 3 or more). A semiconductor layer LA1 located at the lowermost part may be a master layer, and remaining semiconductor layers LA2 to LAk may be slave layers.

The semiconductor layers LA1 to LAk transmit and receive signals by through silicon vias (TSV), and the master layer LA1 may communicate with an external memory controller by conductive paths or means formed on the outer surface. The configuration and operation of the semiconductor storage device 400 will be described on the basis of a first semiconductor layer 410 as the master layer and a k-th semiconductor layer 420 as the slave layer, without limitation thereto.

The first semiconductor layer 410 and the k-th semiconductor layer 420 include various peripheral circuits 422 for driving a memory region 421. For example, as described in FIG. 3, the peripheral circuits 422 may include a row driver (X-Driver) for driving the word lines of each memory region, a column driver (Y-Driver) for driving the bit lines of each memory region, a data I/O unit for controlling input and output of data, a command buffer for inputting and buffering commands (CMD) from the outside, an address buffer for receiving and buffering addresses from the outside, or the like.

The first semiconductor layer 410 may further include control logic. The control logic controls an access to the memory region 421 on the basis of the command and address signal provided from the memory controller (e.g., 20 of FIG. 1 or FIG. 2), and generates control signals for accessing the memory region 421.

The first semiconductor layer 410 may include the active counter 190 according to the embodiment of FIG. 3. The active counter 190 may be placed in the peripheral circuit region of the first semiconductor layer 410 according to an embodiment, or may be placed in a conjunction region of the first semiconductor layer 410 according to another embodiment.

A second semiconductor layer 420 may include the three-phase word line controller 220 according to the embodiment of FIG. 3. The three-phase word line controller 220 may be placed in the peripheral circuit region 422 of the second semiconductor layer 420 according to an embodiment, or may be placed in the conjunction region of the semiconductor layer 420 as shown in FIG. 12 according to another embodiment.

According to an embodiment, the second semiconductor layer 420 may include a plurality of memory cell regions. For example, the second semiconductor layer 420 includes four memory cell regions 421, and may include a row decoder region (SWD) 422 for applying the word line voltage to each memory cell between the memory cell regions 421, a bit line sense amplifier region 423 for sensing the data of each memory cell, a sub-word line driver region (SWD) 422, a row decoder 424, and a column decoder 425. The three-phase word line controller 220 may be placed in the conjunction region in which the bit line sense amplifier region 423 and the sub-word line driver region (SWD) 422 are not placed, according to an embodiment. Alternatively, unlike that shown in FIG. 12, according to another embodiment, the three-phase word line controller 220 may be implemented together in the sub-word line driver region 422.

Figure 14:
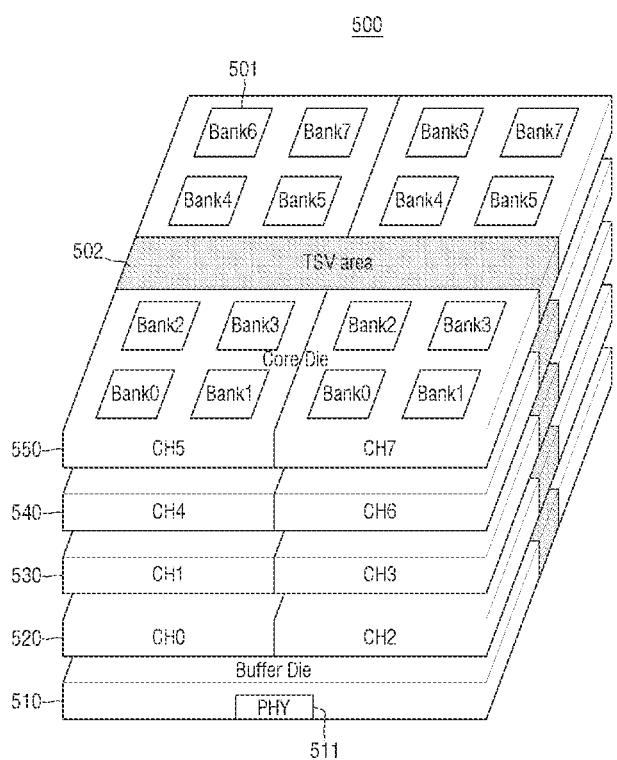
FIG. 14 is a projected block diagram showing a stacked memory device according to an embodiment of the present disclosure.

Turning to FIG. 14, a stacked memory device is indicated by the reference numeral 500, according to an embodiment.

Referring to FIG. 14, a stacked memory device 500 may include a buffer die 510 and a plurality of core dies 520 to 550. For example, the buffer die 510 may also be called an interface die, a base die, a logic die, a master die, or the like, and each of the core dies 520 to 550 may also be called a memory die, a slave die, or the like. In FIG. 14, although the stacked memory device 500 is shown to include four core dies 520 to 550, the number of core dies may be variously changed. For example, the stacked memory device 500 may include eight, twelve, or sixteen core dies.

The buffer dies 510 and core dies 520 to 550 are stacked through the through silicon vias (TSV) and may be electrically connected. As a result, the stacked memory device 500 may have a three-dimensional memory structure in which a plurality of dies 510 to 550 are stacked. For example, the stacked memory device 500 may be implemented on the basis of the HBM or HMC standard, without limitation thereto.

The stacked memory device 500 may support a plurality of functionally independent channels (or vaults). For example, as shown in FIG. 14, the stacked memory device 500 may support eight channels CH0 to CH7. If each of channels CH0 to CH7 supports one-hundred and twenty eight data (DQ) transfer passages (I/O), the stacked memory device 500 may support a thousand and twenty four data transfer passages. However, the present disclosure is not limited thereto, and the stacked memory device 500 may support a thousand and twenty four or more data transfer passages and may support eight or more channels (e.g., sixteen channels). For example, if the stacked memory device 500 supports sixteen channels, each channel may support sixty-four data transfer passages, without limitation thereto.

Each of the core dies 520 to 550 may support at least one channel. For example, as shown in FIG. 14, each of the core dies 520 to 550 may support two channels (CH0-CH2, CH1-CH3, CH4-CH6, and CH5-CH7). In this case, the core dies 520 to 550 may support different channels from each other. However, the present disclosure is not limited thereto, and at least two of the core dies 520 to 550 may support the same channel. For example, each of the core dies 520 to 550 may support a first channel CH0.

Each of the channels may constitute independent commands and data interfaces. For example, each channel may be independently clocked on the basis of independent timing requirements or need not be synchronized with each other. For example, each channel may change power states or perform refreshes on the basis of the independent commands.

Each of the channels may include a plurality of memory banks 501. Each of the memory banks 501 may include memory cells, row decoders, column decoders, sense amplifiers, or the like, connected to the word lines and the bit lines. For example, as shown in FIG. 14, each of the channels CH0 to CH7 may include eight memory banks 501. However, the present disclosure is not limited thereto, and each of channels CH0 to CH7 may include eight or more memory banks 501. Although FIG. 14 shows that the memory banks included in one channel are included in the single core die, the memory banks included in the single channel may be distributed to a plurality of core dies. For example, when each of the core dies 520 to 550 supports the first channel CH0, the memory banks included in the first channel CH0 may be distributed into the core dies 520 to 550.

In an embodiment, the single channel may be divided into two pseudo channels that operate independently. For example, the pseudo channels may share channel commands and clock inputs (e.g., clock signal CK and clock enable signal CKE), but may independently decode and execute the commands. For example, if one channel supports one hundred and twenty eight data transfer passages, each of the pseudo channels may support sixty-four data transfer passages. For example, if one channel supports sixty-four data transfer passages, each pseudo channel may support thirty-two data transfer passages.

The buffer die 510 and the core dies 520 to 550 may include a TSV region 502. TSVs configured to penetrate the dies 510 to 550 may be placed in the TSV region 502. The buffer die 510 may transmit and receive signals and/or data to and from the core dies 520 to 550 through the TSVs. Each of the core dies 520 to 550 may transmit and receive signals and/or data to and from the buffer die 510 and other core dies through the TSV. In this case, the signals and/or data may be transmitted and received independently through the corresponding TSVs for each channel. For example, if an external host device transmits commands and addresses to the first channel CH0 to access the memory cell of the first core die 520, the buffer die 510 may transmit the control signals to the first core die 520 through the TSVs corresponding to the first channel CH0 to access the memory cell of the first channel CH0.

The buffer die 510 may include a physical layer (PHY) 511. The physical layer 511 may include interface circuits for communicating with an external host device. For example, the physical layer 511 may include interface circuits corresponding to the memory device interface described for FIGS. 1 and 2. The signals and/or data received through the physical layer 511 may be transferred to the core dies 520 to 550 through the TSVs.

In an embodiment, the buffer die 510 may include channel controllers corresponding to each of the channels. Each channel controller may manage the memory reference operations of the corresponding channel and determine the timing requirements of the corresponding channel.

In an embodiment, the buffer die 510 may include a plurality of pins for receiving signals from an external host device. The buffer die 510 receives a clock signal CK, a command/address signal C/A, a writing data strobe signal WDQS, and a data signal DQ through the plurality of pins, and may transmit the reading data strobe signal RDQS and the data signal DQ. For example, the buffer die 510 may include two pins for receiving the clock signal CK for each channel, fourteen pins for receiving the command/address signal C/A, eight pins for receiving the writing data strobe signal WDQS, eight pins for transmitting the reading data strobe signal RDQS, and one hundred and twenty eight pins for transmitting and receiving the data signal DQ.

Figure 15:
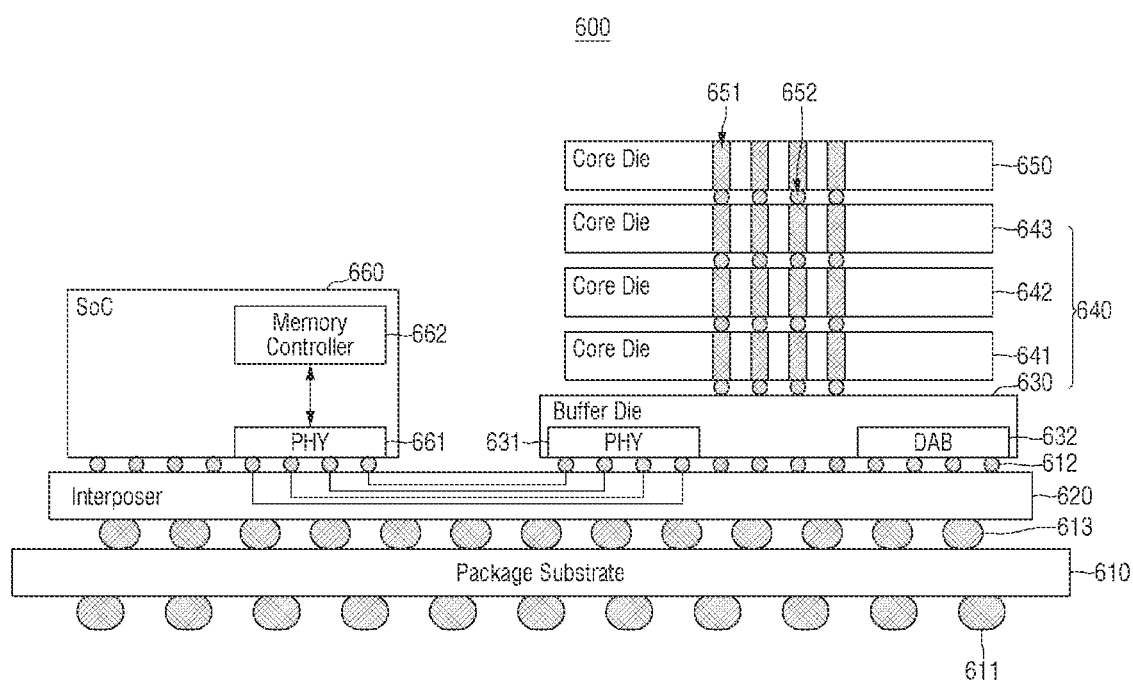
FIG. 15 is a hybrid assembly diagram which shows a semiconductor package according to an embodiment of the present disclosure.

Turning now to FIG. 15, a semiconductor package is indicated generally by the reference numeral 600, according to an embodiment.

Referring to FIG. 15, a semiconductor package 600 may include a stacked memory device 640, a system-on-chip 660, an interposer 620, and a package substrate 610. The stacked memory device 640 may include a buffer die 630 and core dies 641 to 650. The buffer die 630 may correspond to the buffer die 510 of FIG. 14, and each of the core dies 641 to 650 may correspond to each of the core dies 520 to 550 of FIG. 14.

Each of the core dies 641 to 650 may include a memory cell array. The buffer die 630 may include a physical layer 631 and a direct access region (DAB) 632. The physical layer 631 may be electrically connected to a physical layer 661 of the system-on-chip 660 through an interposer 620. The stacked memory device 640 may receive signals from the system-on-chip 660 through the physical layer 631 or may transmit signals to the system-on-chip 660. The physical layer 631 may include the interface circuits of the buffer die 510 described with reference to FIG. 14.

The direct access region 632 may provide an access path that may test the stacked memory device 640 without going through the system-on-chip 660. The direct access region 632 may include conductive means (e.g., ports or pins) that may directly communicate with an external test device. The test signals and data received through the direct access region 632 may be transmitted to the core dies 641 to 650 through the TSVs. The data that are read from the core dies 641 to 650 for testing the core dies 641 to 650 may be transmitted to the test device through the TSVs and the direct access region 632. Accordingly, a direct access test may be performed on the core dies 641 to 650.

The buffer die 630 and the core dies 641 to 650 may be electrically connected to each other through the TSVs 651 and the bumps 652. The buffer die 630 may receive the signal provided to each channel from the system-on-chip 660 through the bumps 652 assigned for each channel. For example, the bumps 652 may be micro bumps.

The system-on-chip 660 may execute the applications supported by the semiconductor package 600, using the stacked memory device 640. For example, the system-on-chip 660 may execute a specialized computation, by including at least one processor of a Central Processing Unit (CPU), an Application Processor (AP), a Graphics Processing Unit (GPU), a Neural Processing Unit (NPU), a Tensor Processing Unit (TPU), a Vision Processing Unit (VPU), an Image Signal Processor (ISP), a Digital Signal Processor (DSP), or the like.

The system-on-chip 660 may include a physical layer 661 and a memory controller 662. The physical layer 661 may include I/O circuits for transmitting and receiving signals to and from the physical layer 631 of the stacked memory device 640. The system-on-chip 660 may provide various signals to the physical layer 631 through the physical layer 661. The signals provided to the physical layer 631 may be transferred to the core dies 641 to 650 through the interface circuits of the physical layer 631 and the TSVs 651.

The memory controller 662 may control the overall operation of the stacked memory device 640. The memory controller 662 may transmit signals for controlling the stacked memory device 640 to the stacked memory device 640 through the physical layer 661. The memory controller 662 may correspond to the memory controller 20 of FIG. 1. Alternately, the memory controller 662 may correspond to the memory controller 20 of FIG. 2.

The interposer 620 may connect the stacked memory device 640 and the system-on-chip 660. The interposer 620 may connect between the physical layer 631 of the stacked memory device 640 and the physical layer 661 of the system-on-chip 660, and may provide physical paths formed using conductive materials. As a result, the stacked memory device 640 and the system-on-chip (SoC) 660 may be stacked on the interposer 620 to transmit and receive signals to and from each other.

Conductors 612, such as cylinders or beads, hollow or solid, may be attached to bottom parts of the buffer die 630 and/or the SoC 660. Bumps 613 may be attached to an upper part of the package substrate 610, and solder balls 611 may be attached to a lower part thereof, without limitation thereto. For example, the bumps 613 may be flip-chip bumps. The interposer 620 may be stacked on the package substrate 610 through the bumps 613. The semiconductor package 600 may transmit and receive signals to and from other external packages or semiconductor devices through the solder balls 611. For example, the package substrate 610 may be a printed circuit board (PCB).

Figure 16:
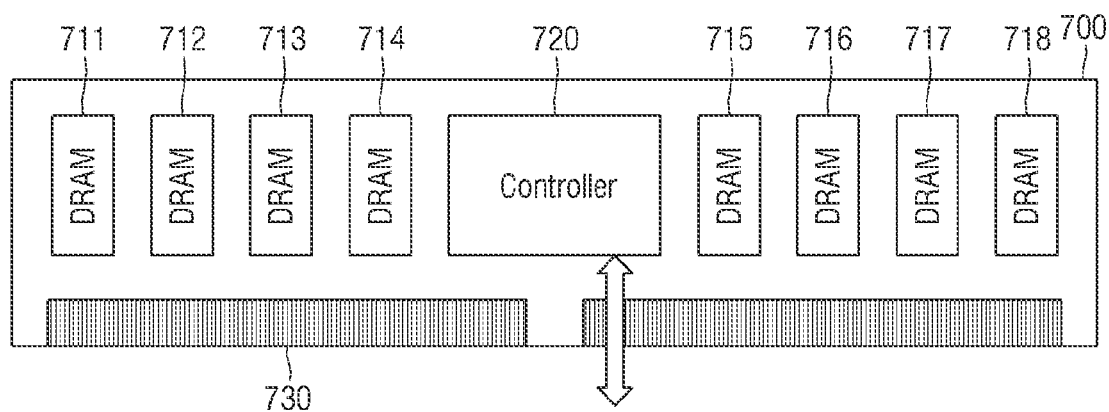
FIG. 16 is a hybrid assembly diagram for explaining a memory module including the memory device according to an embodiment of the present disclosure.

As shown in FIG. 16, is a diagram for explaining a memory module including the memory device according to an embodiment.

Referring to FIG. 16, a memory device is indicated generally by the reference numeral 700. According to an embodiment, a memory device 700 may be mounted on an electronic device in the form of a memory module. At least one or more memory devices 700 may be mounted.

The memory device 700 may include a plurality of volatile memories 711 to 718, a memory controller 720, and memory I/O pins 730. The memory device 700 may write data or output the written data according to the control of an external CPU.

When the memory device 700 includes a DRAM, the CPU may control the memory device 700 according to communication protocols such as Double Data Rate (DDR) and Low Power DDR (LPDDR). For example, in order to read the data stored in the memory device 700, the CPU transmits commands and addresses to the memory device 700.

The plurality of volatile memories 711 to 718 may be at least one of a Dynamic Random-Access Memory (DRAM) or an SDRAM according to an embodiment. Each of the plurality of volatile memories 711 to 718 may communicate the data DQ in response to the signal provided from the memory controller 720. According to an embodiment, the memory device 700 may further include data buffers for data communication, where the data buffers are synchronized with the data strobe signal (DQS) and may exchange data DQ with the memory controller 720.

The memory controller 720 may perform communication on a plurality of volatile memories 711 to 718 according to one or more standards of the memory modules, such as a dual in-line memory module (DIMM), a registered DIMM (RDIMM), a load reduced DIMM (LRDIMM), or a UDIMM according to an embodiment.

The memory controller 720 receives the command/address signal C/A and the clock signal CK of the memory device 700 through the memory I/O pins 730 according to an embodiment, and may provide the received signals to the plurality of volatile memory devices 711 to 718.

Figure 17:
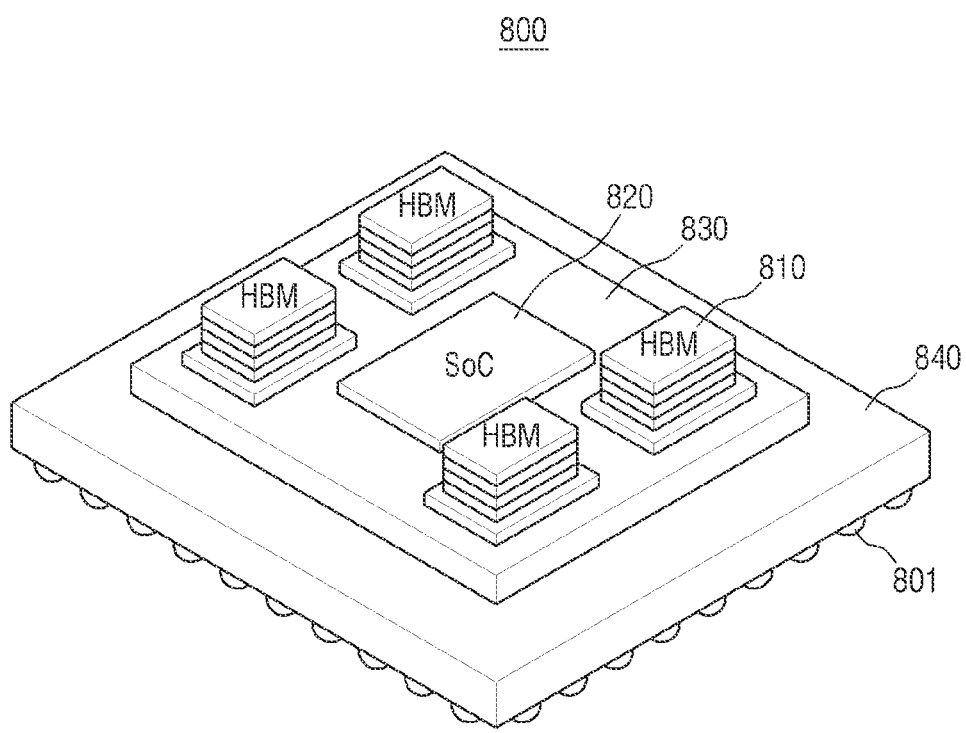
FIG. 17 is an isometric assembly diagram showing an implemented example of a semiconductor package according to an embodiment of the present disclosure.

Turning to FIG. 17, an implemented example of a semiconductor package is indicated generally by the reference numeral 800, according to an embodiment of the present disclosure.

Referring to FIG. 17, a semiconductor package 800 may include a plurality of stacked memory devices 810 and a system-on-chip (SoC) 820. The stacked memory devices 810 and the system-on-chip 820 may be stacked on the interposer 830, and the interposer 830 may be stacked on the package substrate 840. The semiconductor package 800 may transmit and receive signals to and from other external packages or semiconductor devices through solder balls 801 or like conductors attached to the lower part of the package substrate 840.

Each of the stacked memory devices 810 may be implemented on the basis of the HBM standard. However, the present disclosure is not limited thereto, and each of the stacked memory devices 810 may be implemented on the basis of the GDDR, HMC, or Wide I/O standards, without limitation thereto. Each of the stacked memory devices 810 may correspond to the stacked memory device 600 of FIG. 15.

The system-on-chip 820 may include at least one processor such as a CPU, an AP, a GPU, or an NPU and a plurality of memory controllers for controlling a plurality of stacked memory devices 810. The system-on-chip 820 may transmit and receive signals to and from the corresponding stacked memory device through the memory controller. The system-on-chip 820 may correspond to the system-on-chip 400 of FIG. 12.

In concluding the detailed description, those of ordinary skill in the pertinent art may appreciate that many variations and modifications may be made to the described embodiments without departing from the principles of the present disclosure. Therefore, the described embodiments of the disclosure are provided as examples in a generic and descriptive sense, and not for purposes of limitation.

What is claimed is:

1. A memory device comprising:
   a memory cell array having a plurality of memory cells connected to a plurality of word lines and a plurality of bit lines;
   a row decoder circuit connected to the plurality of word lines, and configured to select a first word line among the plurality of word lines based on a row address;
   an active counter circuit configured to generate a control signal based on comparing a number of accesses to the first word line with a preset threshold value;
   a three-phase word line controller configured to determine an operation mode of the sub word line driver circuit based on the control signal; and
   a sub word line driver circuit configured to:
   in a row-hammer protection mode, apply a selected operating voltage to the first word line, and apply a first unselected operating voltage to a second word line among the plurality of word lines, which is different from the first word line; and
   in a normal mode, apply the selected operating voltage to the first word line, and apply a second unselected operating voltage to the second word line, wherein the second unselected operating voltage has a voltage level that is lower than the first unselected operating voltage.

2. The memory device of claim 1, wherein the sub word line driver circuit comprises:
   a PMOS transistor connected between a word line activation address line and a word line node, which outputs the first operated operating voltage to the first word line;
   a first NMOS transistor connected between a first power voltage line and the word line node, which outputs the first unselected operating voltage to the second word line;
   a second NMOS transistor connected between a second power voltage line and the word line node, which is turned on in accordance with the control signal and outputs the second unselected operating voltage to the second word line; and
   a third NMOS transistor connected between a third power voltage line and the word line node, which outputs the first unselected operating voltage to the second word line.

3. The memory device of claim 2, wherein a source of the first NMOS transistor is provided a first negative power voltage, and a source of the second NMOS transistor is provided a second negative power voltage which is lower than the first negative power voltage.

4. The memory device of claim 1, wherein the active counter is configured to count the row address received from a memory controller, and output the control signal to the three-phase word line controller, when the number of activation on the same row address is equal to or greater than the preset threshold number.

5. The memory device of claim 1, wherein the second word line is configured to switch from the first unselected operating voltage to the second unselected operating voltage in accordance with the control signal.

6. The memory device of claim 1, wherein the sub word line driver circuit is configured to apply the second unselected operating voltage to the second word line, when the selected operating voltage is applied to the first word line.

7. The memory device of claim 1, wherein the second word line comprises at least two word lines adjacent to the first word line.

8. The memory device of claim 1, wherein the sub word line driver circuit is configured to apply the second unselected operating voltage to the second word line, after a lapse of a preset time from a time point when the selected operating voltage is applied to the first word line.

9. A memory device comprising:
   a plurality of memory cell regions connected to a plurality of word lines and bit lines and disposed in a slave layer;
   a voltage generator disposed on a master layer, and configured to generate a selected operating voltage, a first unselected operating voltage, and a second unselected operating voltage having a level lower than the first unselected operating voltage;
   a plurality of sub-word line drivers disposed on the slave layer and connected to the plurality of word lines, and configured to apply an operating voltage to the word line; and an active counter disposed on the master layer, and configured to generate a control signal based on comparing a number of accesses to one the plurality of word lines and a predetermined threshold value; and a three-phase word line controller disposed in the slave layer, and configured to control the plurality of sub-word line drivers to apply the selected operating voltage to a first word line among the plurality of word lines selected on the basis of a row address, apply the second unselected operating voltage to a second word line among the plurality of word lines that is adjacent to the first word line, and apply the first unselected operating voltage to a third word line among the plurality of word lines that is not adjacent to the first word line based on the control signal.

10. The memory device of claim 9, wherein the three-phase word line controller comprises:
a PMOS transistor that is turned on in accordance with the row address and outputs the selected operating voltage to the first word line;
a first NMOS transistor that outputs the first unselected operating voltage to the third word line; and
a second NMOS transistor that outputs the second unselected operating voltage to the second word line.

11. The memory device of claim 10, wherein a first negative power voltage is applied to a source of the first NMOS transistor, and a second negative power voltage lower than the first negative power voltage is applied to a source of the second NMOS transistor.

12. The memory device of claim 9,
wherein the active counter is configured to count the number of activation of the first word line included in the row address received from the memory controller, and to output the control signal that activates the three-phase word line controller, when the number of activation is equal to or greater than the predetermined threshold value.

13. The memory device of claim 12, wherein the second word line is configured to switch from the first unselected operating voltage to the second unselected operating voltage when the selected operating voltage is output to the first word line in accordance with the control signal.

14. The memory device of claim 9, further comprising:
a mode register configured to store a plurality of operating mode parameters of the memory device,
wherein the three-phase word line controller is configured to control the second word line to operate at the second unselected operating voltage, based on the first word line being activated according to the operating mode parameter.

15. The memory device of claim 9, further comprising:
a mode register configured to store a plurality of operating mode parameters of the memory device,
wherein three-phase word line controller is configured to control the second word line to switch from the first unselected operating voltage to the second unselected operating voltage after a lapse of a preset time from the first word line being activated according to the operating mode parameter.

16. A memory device comprising:
a plurality of memory cell regions disposed on a plurality of word lines and a plurality of bit lines;
an active counter configured to generate a control signal based on comparing a number of accesses to one the plurality of word lines and a predetermined threshold value; and
a plurality of sub word line drivers including a first sub word line driver, a second sub word line driver and a third sub word line driver, each of the plurality of sub word line drivers comprising:
a PMOS transistor which is connected to a word line activation address line at one side, and configure to output a selected operating voltage;
a first NMOS transistor which is connected to a first power voltage line different from the word line activation address line at one side, and configured to output a first unselected operating voltage;
a second NMOS transistor which is connected to a second power voltage line different from the first power voltage line at one side, and configured to output a second unselected operating voltage lower than the first unselected operating voltage;
a three-phase word line controller configured to control the plurality of sub word line driver based on the control signal;
a first sub-word line driver configured to apply the selected operating voltage to the first word line on the basis of a row address;
a second sub-word line driver configured to apply the second unselected operating voltage to a second word line adjacent to the first word line; and
a third sub-word line driver configured to apply the first unselected operating voltage to a third word line adjacent to the second word line in a direction opposite to the first word line.

17. The memory device of claim 16, wherein the active counter is configured to count the number of activation of the first word line received from the memory controller, and to output the control signal to the first NMOS transistor and the second NMOS transistor, when the number of activation is equal to or greater than a preset threshold number.

18. The memory device of claim 17, wherein the second sub-word line driver and the third sub-word line driver apply the first unselected operating voltage or the second unselected operating voltage on the basis of the control signal.

19. The memory device of claim 16, wherein the second sub-word line driver is configured to control the second word line to switch from the first unselected operating voltage to the second unselected operating voltage and operate, after a lapse of a preset time from a time point when the first word line is activated on the basis of the operating mode parameter.

20. The memory device of claim 16, wherein the second sub-word line driver is configured to control the second word line to operate at the second unselected operating voltage based on the first word line being activated.

* * * * *